United States Patent
Ueda et al.

(10) Patent No.: US 7,890,918 B2
(45) Date of Patent: Feb. 15, 2011

(54) METHOD OF DESIGNING SEMICONDUCTOR DEVICE

(75) Inventors: Takashi Ueda, Kanagawa (JP); Yuko Nagaya, Kanagawa (JP)

(73) Assignee: Renesas Electronics Corporation, Kawasaki (JP)

( * ) Notice: Subject to any disclaimer, the term of this patent is extended or adjusted under 35 U.S.C. 154(b) by 871 days.

(21) Appl. No.: 11/798,557

(22) Filed: May 15, 2007

(65) Prior Publication Data
US 2007/0277136 A1 Nov. 29, 2007

(30) Foreign Application Priority Data
May 23, 2006 (JP) ............................ 2006-143021
Apr. 11, 2007 (JP) ............................ 2007-103549

(51) Int. Cl.
*G06F 17/50* (2006.01)
(52) U.S. Cl. ........................................ 716/131; 716/55
(58) Field of Classification Search ................ 716/20
See application file for complete search history.

(56) References Cited

U.S. PATENT DOCUMENTS

| | | | |
|---|---|---|---|
| 6,253,362 B1 | 6/2001 | Anand et al. | |
| 7,114,144 B2 * | 9/2006 | Tokunaga et al. | 716/21 |
| 7,185,311 B2 * | 2/2007 | Inoue | 716/19 |
| 7,383,521 B2 * | 6/2008 | Smith et al. | 716/6 |
| 2005/0160381 A1 * | 7/2005 | Idani et al. | 716/1 |

FOREIGN PATENT DOCUMENTS

| | | |
|---|---|---|
| JP | 11-126822 | 5/1999 |
| JP | 2000-68277 | 3/2000 |
| JP | 2002-342399 | 11/2002 |

* cited by examiner

*Primary Examiner*—Jack Chiang
*Assistant Examiner*—Brandon W Bowers
(74) *Attorney, Agent, or Firm*—Young & Thompson

(57) ABSTRACT

A method of designing a semiconductor device includes: (A) dividing a layout region of a semiconductor chip into matrix by a unit region; and (B) determining an interconnection layout such that an occupation ratio of a high-density region to the layout region is less than 50%. Here, the high-density region is a set of the unit regions in each of which interconnection density is higher than a predetermined reference value.

12 Claims, 12 Drawing Sheets

100: MEMORY DEVICE

METHOD OF DESIGNING SEMICONDUCTOR DEVICE

BACKGROUND OF THE INVENTION

1. Field of the Invention

The present invention relates to a method of designing a semiconductor device. In particular, the present invention relates to a method of laying out interconnections in a semiconductor device.

2. Description of Related Art

CMP (Chemical Mechanical Polishing) is known as a technique for planarization employed in a production process of a semiconductor device. The CMP is used for planarizing a metal interconnection or for planarizing an interlayer insulating film when a multi-layer interconnection structure is formed.

For example, the CMP is employed when a low resistivity Cu (copper) interconnection is formed by a method called a damascene process. More specifically, after a trench is formed on an insulating film, the Cu is deposited into the trench and then excess Cu outside the trench is polished away by the CMP. Here, in a case when a width of the formed Cu interconnection is large, a phenomenon called "dishing" that the CMP planarized surface is formed in a dish shape occurs. A technique aimed at suppressing the dishing of the Cu interconnection is described in Japanese Laid-Open Patent Application JP-2000-68277. According to the technique, a wide metal interconnection is divided into a stripe pattern.

The CMP is also used for planarizing an interlayer insulating film when a multi-layer interconnection structure is formed. FIGS. 1A and 1B are cross-sectional views illustrating a general process of forming an interlayer insulating film. In FIG. 1A, metal interconnections 1 are nonuniformly distributed, and thus there are a dense region R1 and a sparse region R2. Interconnection density of the metal interconnection 1 in the dense region R1 is higher than that in the sparse region R2. An interlayer insulating film 2 is so deposited as to cover the metal interconnections 1, by a plasma CVD (Chemical Vapor Deposition) method or a high-density plasma CVD (HDP-CVD) method. A surface of the interlayer insulating film 2 thus formed reflects the underneath metal interconnections 1 and is not flat. Specifically, the interlayer insulating film 2 in the dense region R1 is formed relatively thick, while the interlayer insulating film 2 in the sparse region R2 is formed relatively thin.

If the CMP is performed under the condition shown in FIG. 1A, a surface of the interlayer insulating film 2 in the sparse region R2 becomes lower than a surface of the interlayer insulating film 2 in the dense region R1, as shown in FIG. 1B. That is to say, although the flatness is improved locally, a global unevenness (dishing) remains on the surface of the interlayer insulating film 2 after the CMP. As a result, out of focus occurs in a photolithography process, which deteriorates reliability of the semiconductor device to be manufactured. Moreover, since the interlayer insulating film 2 in the sparse region R2 becomes thinner than that in the dense region R1, capacitance of the interlayer insulating film 2 varies spatially. Therefore, electrical characteristics of the manufactured semiconductor device are deteriorated.

Techniques aimed at suppressing the dishing of the interlayer insulating film are disclosed in, for example, Japanese Laid-Open Patent Application JP-H11-126822 and Japanese Laid-Open Patent Application JP-2002-342399. As described above, the dishing of the interlayer insulating film is likely to occur when variation in the interconnection density is conspicuous. Therefore, according to the techniques described in those patent documents, a dummy interconnection different from a true interconnection is formed in a region where the dishing may occur.

FIGS. 2A and 2B are cross-sectional views illustrating an example where interconnections including the dummy interconnection are formed. In FIGS. 2A and 2B, a region R1 corresponds to a region where interconnection density of the true interconnection is relatively high, while a region R2 corresponds to a region where interconnection density of the true interconnection is relatively low. As shown in FIG. 2A, a barrier metal film 4 is formed on an insulating film 3, and an Al film 5 is formed on the barrier metal film 4. The barrier metal film 4, which is for example a TiN film, plays a role of improving adhesiveness between the Al film 5 and the insulating film 3 and preventing the Al from diffusing into the insulating film 3. Further, a resist mask 6 having a predetermined pattern is formed on the Al film 5.

Next, a dry etching such as an RIE (Reactive Ion Etching) is performed by using the resist mask 6. As a result, as shown in FIG. 2B, true interconnections 7 are formed in the region R1, and dummy interconnections 8 in addition to true interconnections 7 are formed in the region R2. Only the true interconnections 7 of them are used for a circuit operation. In this manner, according to the conventional technique, the dummy interconnections 8 different from an interconnection pattern are formed in the region R2 where the dishing may occur. Consequently, the variation in the interconnection density is reduced and hence the dishing of the interlayer insulating film to be formed is suppressed.

The inventors of the present application have recognized the following points. To form the dummy interconnections 8 as described above means that the interconnection density as a whole is increased. If the interconnection density is increased too much, the following problem arises in the dry etching process shown in FIG. 2B.

In general, an end point of the dry etching is determined by monitoring emission intensity of reaction product generated during the etching. FIG. 3 shows transition of plasma emission intensity during the dry etching process. In FIG. 3, a solid line (Sample-A) represents the emission intensity in a case where the dummy interconnection 8 is not formed. On the other hand, a dashed line (Sample-B) represents the emission intensity in a case where the dummy interconnection 8 is formed, namely, the interconnection density is increased.

As the etching progresses, the emission intensity associated with the Al film 5 decreases, whereas the emission intensity associated with the barrier metal film 4 increases. When the emission intensity associated with the barrier metal film 4 is expressed as a negative value, the emission intensity as a whole begins to decrease during the etching, as shown in FIG. 3. A point at which the decrease stops is recognized as the end point of the dry etching. In the case of the solid line (Sample-A), the gradient of the decrease is large and thus the end point of the dry etching can be detected well.

On the other hand, in the case of the dashed line (Sample-B), an area occupied by the resist mask 6 becomes large because the dummy interconnections 8 are formed and thus an exposed area of the Al film 5 or the barrier metal film 4 becomes small. Therefore, the emission intensity associated with the Al film 5 and the emission intensity associated with the barrier metal film 4 become weaker than in the case of the above-mentioned Sample-A. Consequently, the gradient of the decrease of the emission intensity becomes smaller and thus the end point of the dry etching may not be detected precisely. If the end point of the dry etching is not detected precisely, over-etching occurs or etching residue remains.

This causes deterioration of the electrical characteristics and the reliability of the semiconductor device.

As described above, when the dummy interconnections 8 are formed in order to suppress the variation in the interconnection density, the interconnection density as a whole is further increased and thus the problem arises in the dry etching process. Moreover, when the dummy interconnections 8 are formed, such a problem that interconnect capacitance is increased also arises.

SUMMARY

The inventors of the present application have focused attention on an "occupation ratio" of a high interconnection density region (dense region) to the whole of a semiconductor chip, and have found that the dishing of an interlayer insulating film occurs during the production process if the occupation ratio is equal to or more than 50%. In other words, it has been found that the occurrence of the dishing during the production process is suppressed if the occupation ratio is less than 50%.

Of course if whole of an interconnection region of one interconnection layer on a semiconductor chip is the above-mentioned dense region R1, the dishing can not occur. However, it is quite rate that the whole of the interconnection region becomes the dense region R1 on the design requisition without using the dummy interconnection or the like. In a case of usual product, there are both of the dense region R1 and the sparse region R2. In that case, it is possible to suppress the occurrence of the dishing within an allowable range by designing interconnections in accordance with the above-mentioned knowledge found by the present inventors. According to the present invention, a technique is provided which suppresses the occurrence of the dishing by balancing the dense region R1 and the sparse region R2 in the case where there are both the dense region R1 and the sparse region R2.

More specifically, a method of designing a semiconductor device according to one embodiment of the present invention includes: (A) dividing a layout region of a semiconductor chip into matrix by a unit region; and (B) determining an interconnection layout such that an occupation ratio of a high-density region to the layout region is less than 50%. Here, the high-density region is a set of the unit regions in each of which interconnection density is higher than a predetermined reference value.

When the semiconductor device is designed in this manner, the dishing of the interlayer insulating film is suppressed during the production process. Moreover, since it is not necessary to form a dummy interconnection, the increase in the interconnection density due to the dummy interconnection can be prevented. It is therefore possible to precisely detect the end point of the dry etching. As a result, the occurrence of over-etching or residue can be prevented, which improves characteristics of the semiconductor device. Furthermore, since it is not necessary to form a dummy interconnection, the increase in the interconnect capacitance can be also prevented.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A method of designing a semiconductor device according to the embodiments of the present invention will be described with reference to the attached drawings. The semiconductor device according to the embodiments is, for example, a logic device in which interconnections are formed without regularity.

1. First Embodiment

Figure 4:
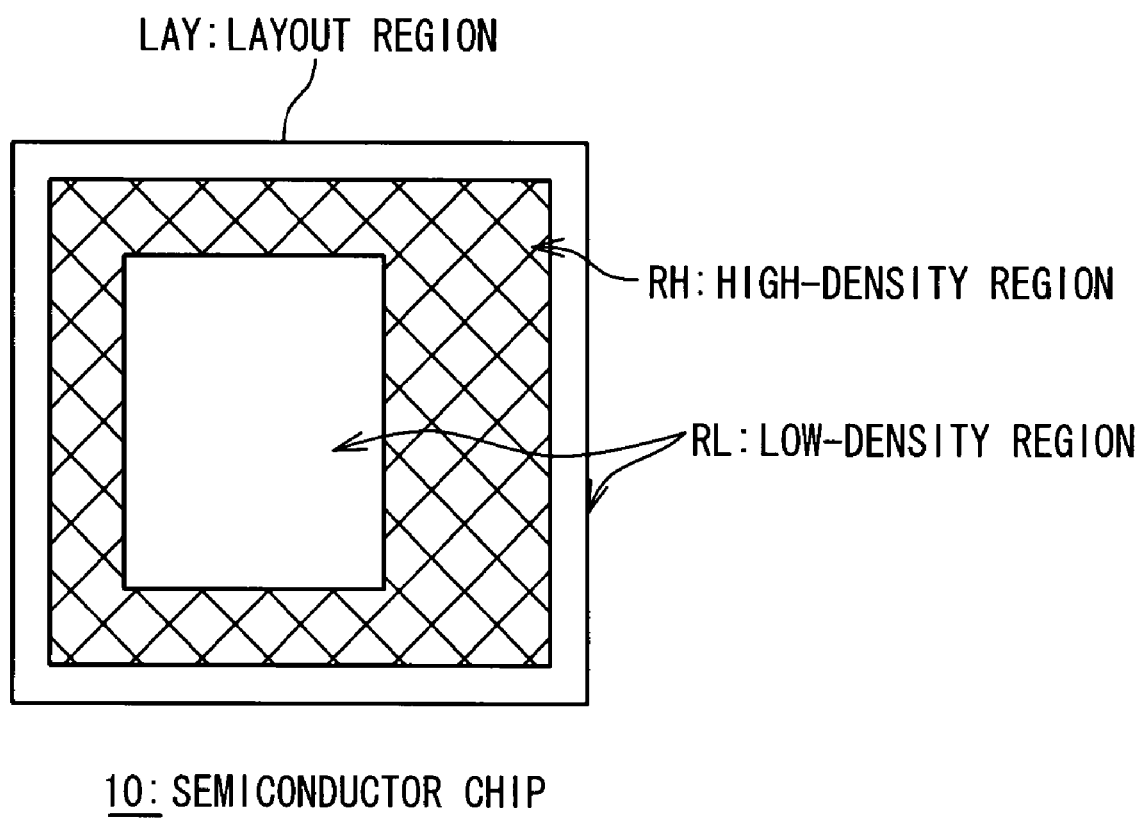
FIG. 4 is a plan view showing a layout region of a semiconductor chip according to embodiments of the present invention.

FIG. 4 conceptually shows an example of a design-target semiconductor device. A layout region LAY is defined corresponding to a chip (semiconductor chip 10) of the semiconductor device. A plurality of interconnections are laid-out within the layout region LAY.

In FIG. 4, the layout region LAY is classified into a high-density region RH in which the interconnection density is relatively high and a low-density region RL in which the interconnection density is relatively low. Specifically, the high-density region RH is defined as a region where the interconnection density per unit area is higher than a predetermined reference value. On the other hand, the low-density region RL is defined as a region where the interconnection density per unit area is equal to or less than the predetermined reference value. The predetermined reference value is set to 70%, for example.

In this case, an occupation ratio OCC of the high-density region RH to the layout region LAY is calculated by the following equation (1):

$$\text{Occupation ratio } OCC = (\text{Area of the high-density region } RH)/(\text{Area of the layout region } LAY) \quad (1)$$

Figure 5:
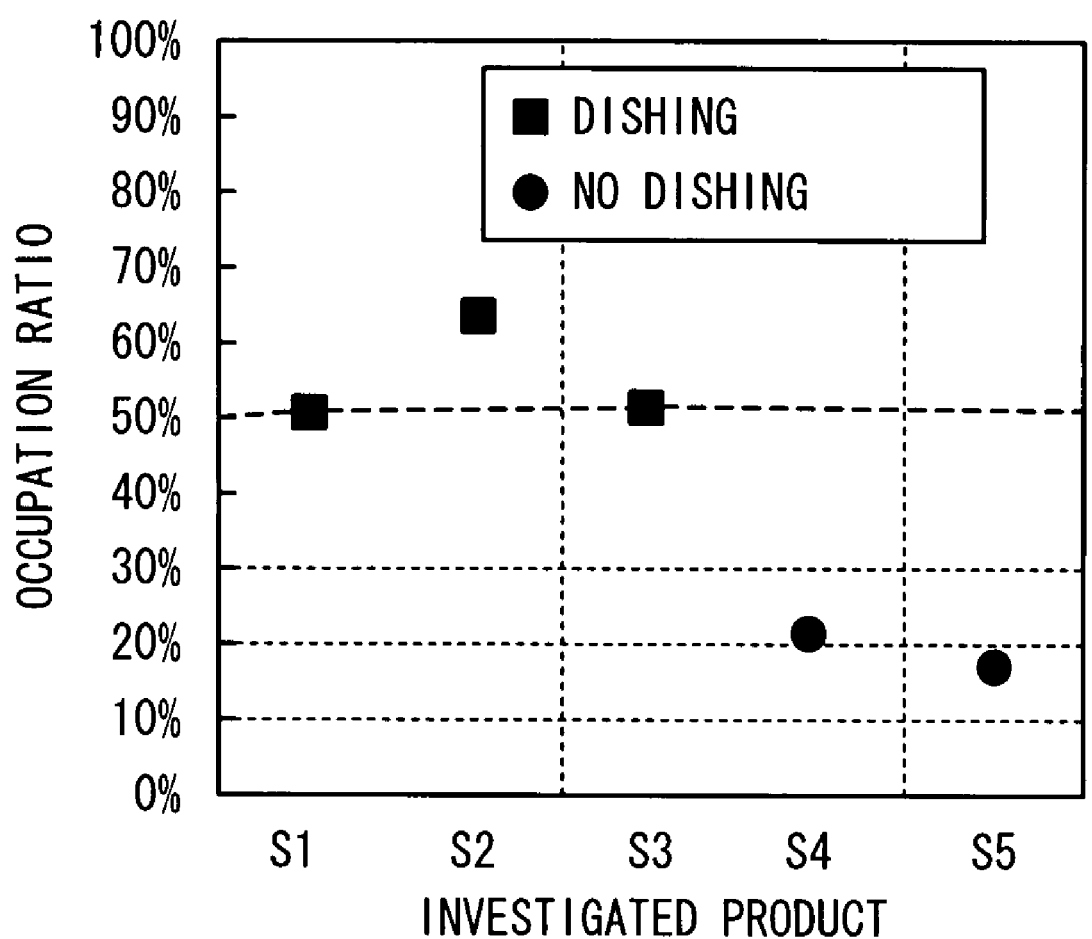
FIG. 5 is a graph showing a relationship between occupation ratio of high-density region and occurrence of dishing.

The inventors of the present application have investigated whether or not the dishing of the interlayer insulating film occurred, with regard to a plurality of products having different occupation ratios OCC of the high-density region RH. FIG. 5 shows a relationship between the occupation ratio OCC and occurrence of the dishing that is obtained by the investigation. Here, a unit region is a square whose length on a side is one third of a width of a scribe line, the unit region in which the interconnection density is higher than 70% is extracted as the high-density region RH, and then the occupation ratio OCC of the high-density region RH is calculated. As for the occurrence of the dishing, a case where unevenness on the interlayer insulating film is 0.3 micrometers or less (within the allowable range) is determined as "No dishing", while the other cases are determined as "Dishing occurrence". It can be seen from FIG. 5 that the dishing of the interlayer insulating film occurs when the occupation ratio OCC is equal to or more than 50%. To put it the other way around, it is necessary to determine the interconnection layout such that the occupation ratio OCC of the high-density region RH becomes less than 50%, in order to suppress the dishing. Due to such the interconnection layout, the high-density region RH and the low-density region RL are balanced and thus the dishing can be reduced.

Figure 6:
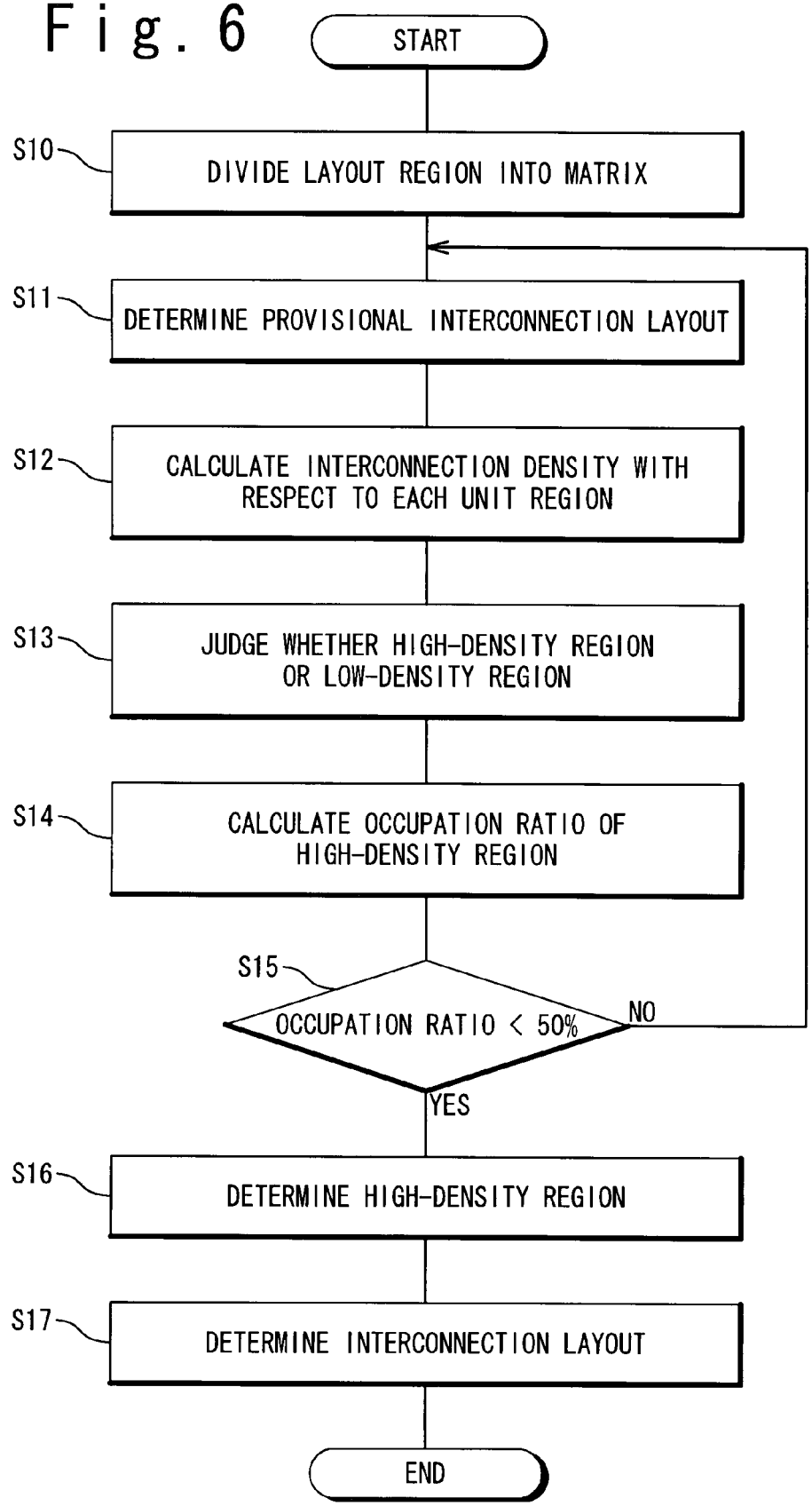
FIG. 6 is a flow chart showing a method of laying out interconnections according to a first embodiment of the present invention.

The method of laying out interconnections according to the present embodiment will be described below in more detail with reference to a flowchart shown in FIG. 6.

Figure 7:
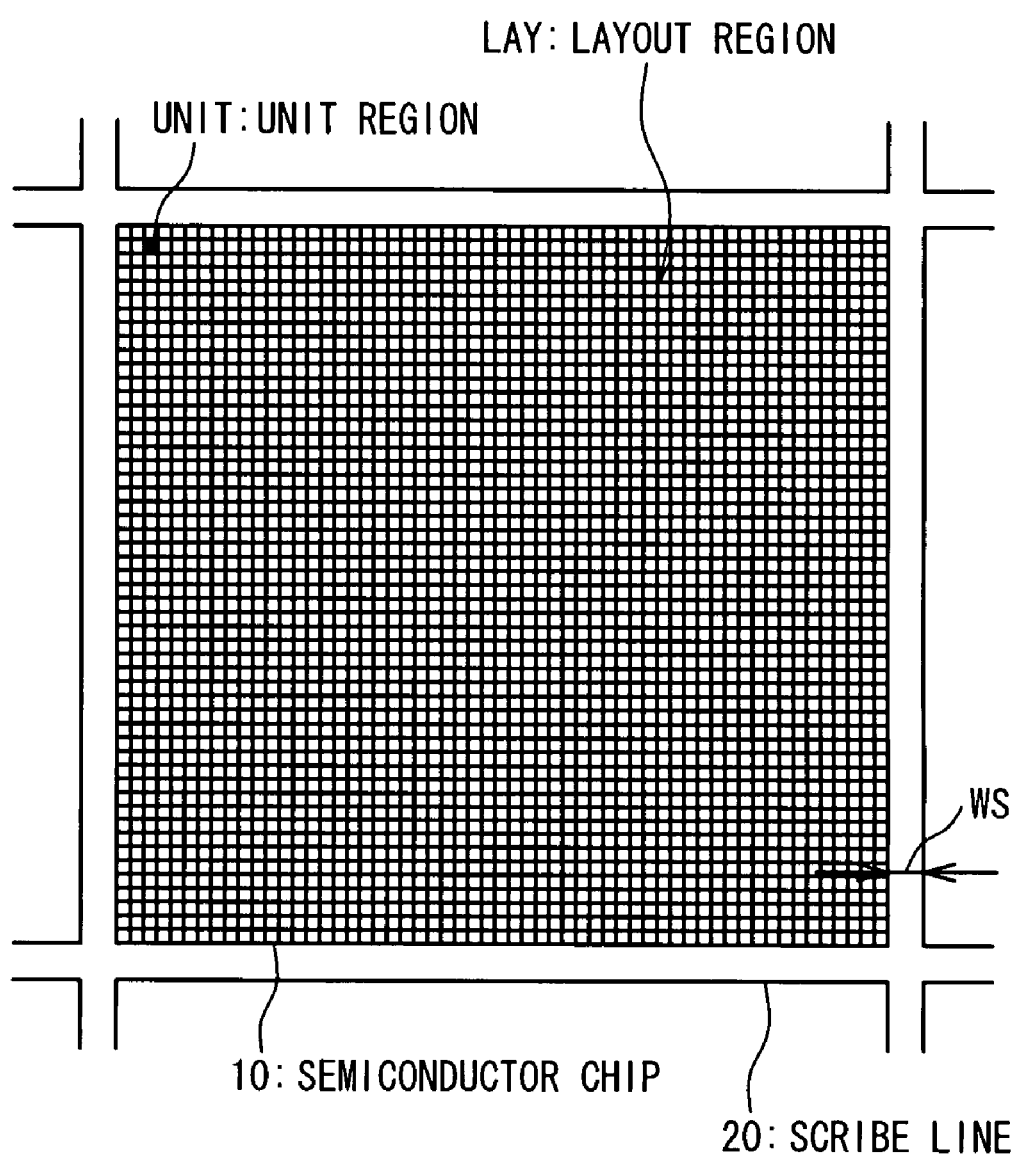
FIG. 7 is a plan view for explaining the method of laying out interconnections according to the first embodiment.

Step S10:

First, the layout region LAY of the semiconductor chip 10 is divided into a plurality of unit regions UNIT. An example of the layout region LAY that is divided into the plurality of unit regions UNIT is shown in FIG. 7. As shown in FIG. 7, the plurality of unit regions UNIT are arranged in a matrix. That is to say, the layout region LAY is divided into matrix by the unit region UNIT. Each unit region UNIT has a square shape.

In FIG. 7, a scribe line 20 surrounding the semiconductor chip 10 is also shown. In a dicing process with respect to a semiconductor wafer, the dicing is performed along the scribe line 20. It is preferable that a length of a side of the unit region UNIT is smaller than a width WS of the scribe line 20 as shown in FIG. 7. For example, the length of a side of each unit region UNIT is set to one third of the width WS. In a case where the width WS of the scribe line 20 is 100 micrometers, the unit region UNIT is set to a 33 micrometers square. As a result, it is possible to calculate a local interconnection density with a high degree of accuracy, which will be described later.

Step S11:

A plurality of interconnections are laid out in the layout region LAY. An interconnection layout determined at the present stage is a provisional one.

Step S12:

Next, the interconnection density is calculated with respect to each of the above-mentioned unit regions UNIT. The interconnection density DW in a certain unit region UNIT is given by the following equation (2):

$$\text{Interconnection density } DW = (\text{Interconnection area within the unit region})/(\text{Area of the unit region}) \quad (2)$$

Since a side of the unit region UNIT is set smaller than the width WS of the scribe line 20, it is possible to calculate the local interconnection density DW with a high degree of accuracy.

Step S13:

Next, whether each unit region UNIT is categorized as the high-density region RH or the low-density region RL is judged based on the calculated interconnection density DW. More specifically, if the calculated interconnection density DW is higher than a predetermined reference value, the unit region UNIT is added to the high-density region RH. On the other hand, if the calculated interconnection density DW is equal to or lower than the predetermined reference value, the unit region UNIT is added to the low-density region RL. The predetermined reference value is set to 70%, for example. In this manner, the high-density region RH is determined by extracting the corresponding unit regions UNIT.

Step S14:

The high-density region RH is a set of the unit regions UNIT in each of which the interconnection density DW is higher than the reference value. The summation area of such the unit regions UNIT corresponds to the area of the high-density region RH in the layout region LAY. Therefore, on the basis of the foregoing equation (1), the occupation ratio OCC of the high-density region RH to the whole of the layout region LAY can be calculated.

Step S15:

In a case where the calculated occupation ratio OCC is 50% or more (Step S15; No), the above-mentioned Steps S11 to S14 are executed again. In a case where the calculated occupation ratio OCC is less than 50% (Step S15; Yes), the dishing of the interlayer insulating film is suppressed as shown in FIG. 5. Therefore, a range of the current high-density region RH is adopted (Step S16), and the current interconnection layout is determined as a final interconnection layout (Step S17).

It should be noted here that since an interconnection layer is formed through an interlayer insulating film and a connection plug on elements such as transistors formed on a semiconductor substrate, the interconnection layout is obviously subjected to constraints from the placement of these elements. In particular, the placement of the connection plug is constrained by the placement of the elements such as transistors. However, the interconnection itself has layout flexibility to some extent, because there are both the dense region and the sparse region. As described above, if the calculated occupation ratio OCC is equal to or more than 50% (Step S15; No), the process returns back to the Step S11 and the layout process is repeated. In the re-layout process, for example, an interconnection that can be moved to another unit region UNIT (ex: an adjacent unit region UNIT) is moved to the unit region UNIT. By repeating such an operation, the occupation ratio OCC is reduced to less than 50%. If it is impossible to reduce the occupation ratio OCC less than 50% even by repeating such an operation, the placement of the elements such as transistors is changed.

According to the present embodiment, as described above, the interconnection layout is determined such that the occupation ratio OCC of the high-density region RH becomes less than 50%. As a result, the dishing of the interlayer insulating film is suppressed during the production process, as shown in FIG. 5. Moreover, since it is not necessary to form a dummy interconnection, the increase in the interconnection density due to the dummy interconnection can be prevented. It is therefore possible to precisely detect the end point of the dry etching. As a result, the occurrence of over-etching or residue can be prevented, which improves characteristics of the semiconductor device. Furthermore, since it is not necessary to form a dummy interconnection, the increase in the interconnect capacitance can be also prevented.

2. Second Embodiment

In the first embodiment, the high-density region RH is designed such that the occupation ratio OCC becomes less than 50%. It is also possible to further disperse the high-density region RH within the layout region LAY with keeping the occupation ratio OCC. In this case, the balance of arrangement of the high-density region RH and the low-density region RL in the semiconductor chip 10 is further improved, and thus the dishing of the interlayer insulating film can be further reduced. In the second embodiment, a method of distributing the high-density region RH to the layout region LAY will be explained.

Figure 8:
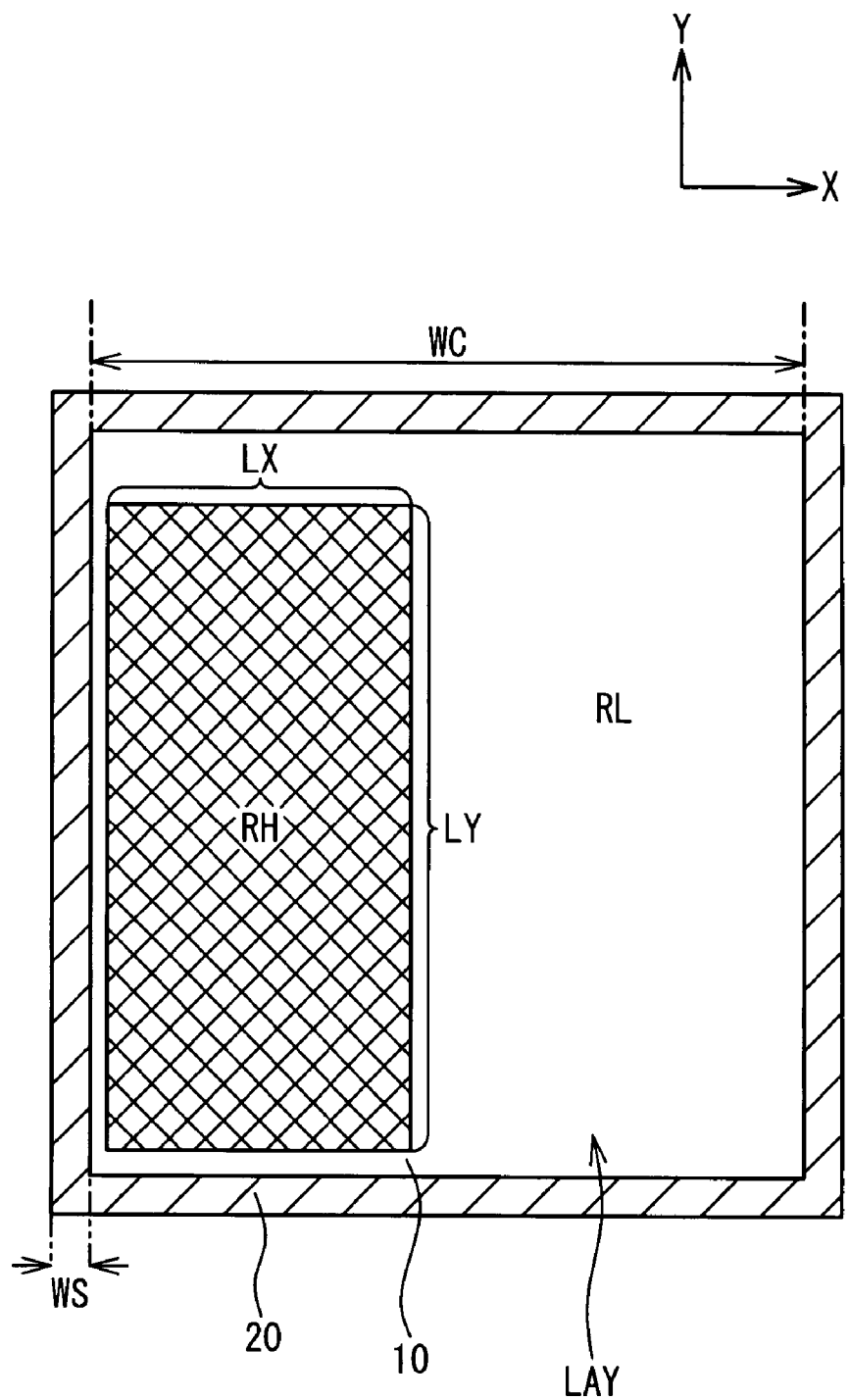
FIG. 8 is a plan view for explaining a method of laying out interconnections according to a second embodiment of the present invention.

FIG. 8 conceptually shows an example of a design-target semiconductor chip 10. The scribe line 20 surrounding the semiconductor chip 10 is also shown in FIG. 8. A length of a side of the semiconductor chip 10 is "WC", and the width of the scribe line 20 is "WS". In FIG. 8, the layout region LAY is classified into the high-density region RH and the low-density region RL. As a result of the layout process described in the first embodiment, the occupation ration OCC of the high-density region RH is less than 50%.

Moreover, it is assumed that the high-density region RH is distributed continuously in the X-direction and the Y-direction. In FIG. 8, the high-density region RH has a rectangular shape, and lengths along the X-direction and the Y-direction are "LX" and "LY", respectively. It is also assumed that the length LX in the X-direction is smaller than the length LY in the Y-direction (LX<LY). Furthermore, it is assumed that the length LX and the width WC of the semiconductor chip 10 in the X-direction satisfy the following relation:

$$LX < WC/2 \quad (3)$$

Since the occupation ratio OCC of the high-density region RH is less than 50%, the high-density region RH that satisfies the above-mentioned relation (3) is possible.

Figure 9:
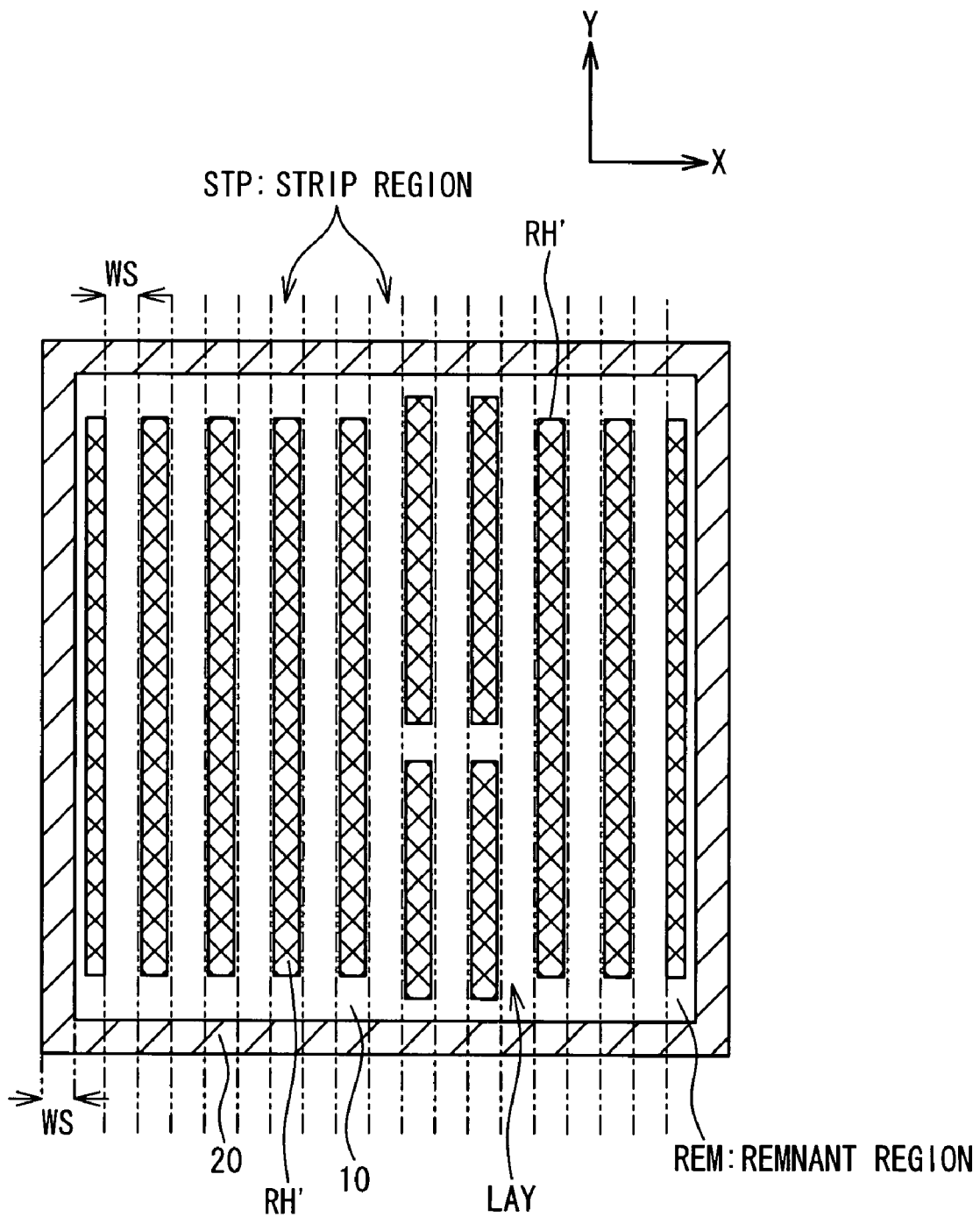
FIG. 9 is a plan view for explaining the method of laying out interconnections according to the second embodiment.

As shown in FIG. 9, the high-density region RH is divided into a plurality of divided high-density regions RH'. Since the length LX is smaller than the length LY, it is convenient to divide the high-density region RH such that the plurality of divided high-density regions RH' align in the X-direction. The plurality of divided high-density regions RH' are distributed to the layout region LAY. Particularly in FIG. 9, the plurality of divided high-density regions RH' are placed in a stripe pattern.

More specifically, the layout region LAY is firstly divided into a plurality of strip regions STP. Each strip region STP has a strip shape and its longitudinal direction is the Y-direction orthogonal to the X-direction. The plurality of strip regions STP align in the X-direction and respective widths are the same. In order to obtain such the plurality of strip regions STP, for example, the layout region LAY is virtually divided by lines equally spaced from the left edge towards the +X-direction. The division width is set to a predetermined value. In this case, a remnant region REM whose width does not reach the predetermined value may appear at the right edge of the layout region LAY, which does not matter. Alternatively, the layout region LAY can be virtually divided from the right edge towards the −X-direction.

It is preferable that the width of each strip region STP in the X-direction is set to be equal to the width WS of the scribe line 20. In other words, the above-mentioned predetermined width with which the layout region LAY is divided is preferably equal to the width WS of the scribe line 20. The reason is as follows. No interconnection is placed in the scribe line 20, namely, the scribe line 20 corresponds to the low-density region RL with low data density. To use such the scribe line 20 as a reference is desirable in view of achieving the balance of placement of the high-density region RH and the low-density region RL.

Next, the high-density region RH is divided into the plurality of divided high-density regions RH'. At this time, a width of each divided high-density region RH' in the X-direction is set to be smaller than the width WS of the scribe line 20 (WH<WS). That is to say, the high-density region RH is divided into the plurality of divided high-density regions RH' such that the width WH becomes smaller than the width WS of one strip region STP.

Then, the plurality of divided high-density regions RH' are placed dispersively in the corresponding number of the strip regions STP, respectively. For example, the plurality of divided high-density regions RH' are placed in at least every other strip region STP with respect to the plurality of strip regions STP. As a result, as shown in FIG. 9, the plurality of divided high-density regions RH' are placed in a stripe pattern. A divided high-density region RH' may be placed in the remnant region REM. Moreover, a divided high-density region RH' in a certain strip region RTP may be further divided in the Y-direction.

Figure 10:
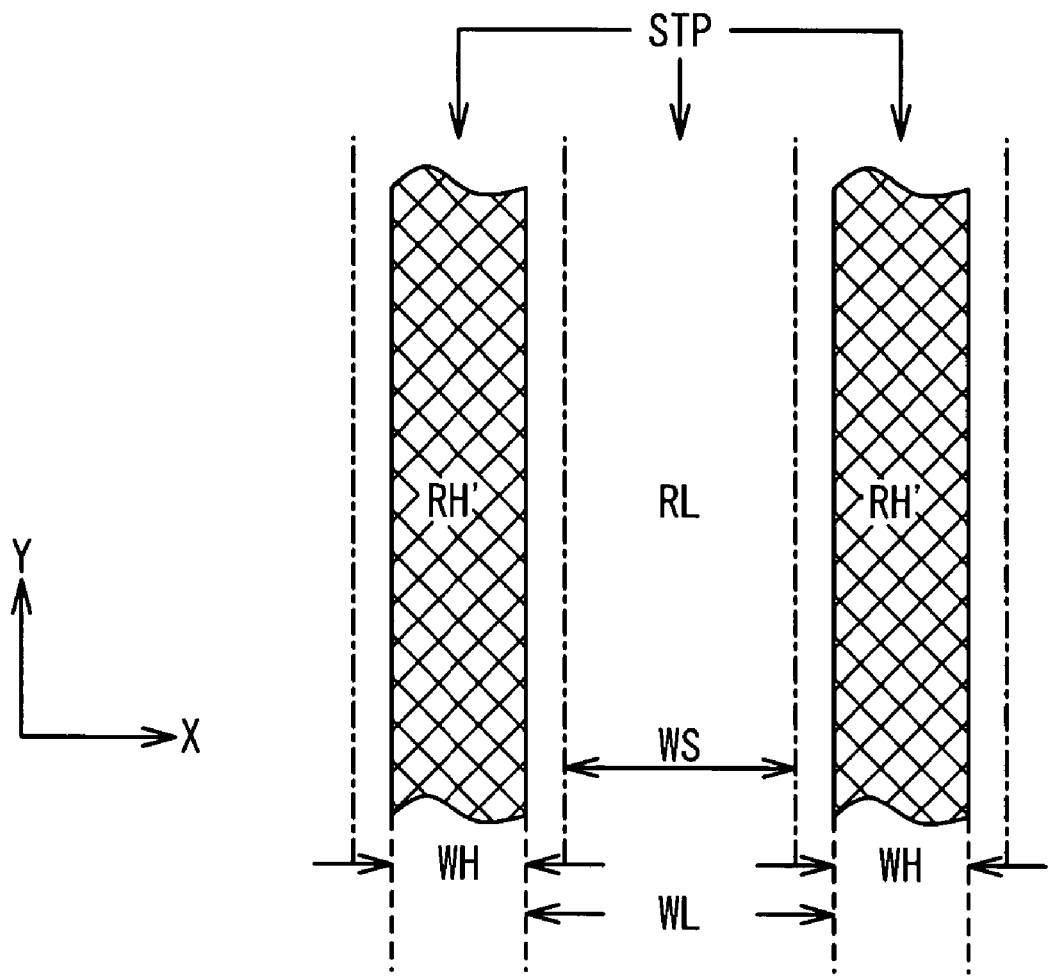
FIG. 10 is a plan view for explaining the method of laying out interconnections according to the second embodiment.

FIG. 10 is a magnified view of a part of the layout region LAY shown in FIG. 9. The width of each strip region STP in the X-direction is set to the width WS of the scribe line 20. Moreover, the width WH of each divided high-density region RH' in the X-direction is set smaller than the width WS, as described above. Furthermore, the divided high-density regions RH' are placed in every other strip region STP. Therefore, an interval WL between two adjacent divided high-density regions RH', namely, a width WL of a low-density region RL sandwiched between the two divided high-density regions RH' is larger than the width WS. That is to say, the following relations are satisfied.

$$WH < WS \quad (4)$$

$$WL > WS \quad (5)$$

In this manner, the low-density region RL with a sufficient width is secured between the adjacent divided high-density regions RH'. It is therefore possible to further reduce the dishing of the interlayer insulating film. In other words, since the balance of placement of the high-density region RH and the low-density region RL in the semiconductor chip 10 is improved, the dishing of the interlayer insulating film is reduced.

If the length LX of the high-density region RH in the X-direction satisfies the above-mentioned relation (3), such the division that achieves the above-mentioned relation (5) is possible. For example, let us consider a case when the number of the strip regions STP is an even number 2 m (m is a natural number). If the above-mentioned relation (3) is satisfied, it is obviously possible to distribute the plurality of divided high-density regions RH' to m strip regions STP. When m strip regions STP in which the divided high-density regions RH' are placed and m strip regions STP in which the divided high-density regions RH' are not placed appear alternately, the stripe pattern can be obtained. That is to say, the divided high-density regions RH' are placed in every other strip region STP and the above-mentioned relation (5) is satisfied. Also, in a case when the number of the strip regions STP is an odd number (2 m+1), it is possible to place the divided high-density regions RH' in up to m+1 strip regions STP including both ends. The same discussion as in the former case can be applied to the present case. If the above-mentioned relation (3) is satisfied, the relation (5) is obviously satisfied.

Figure 11:
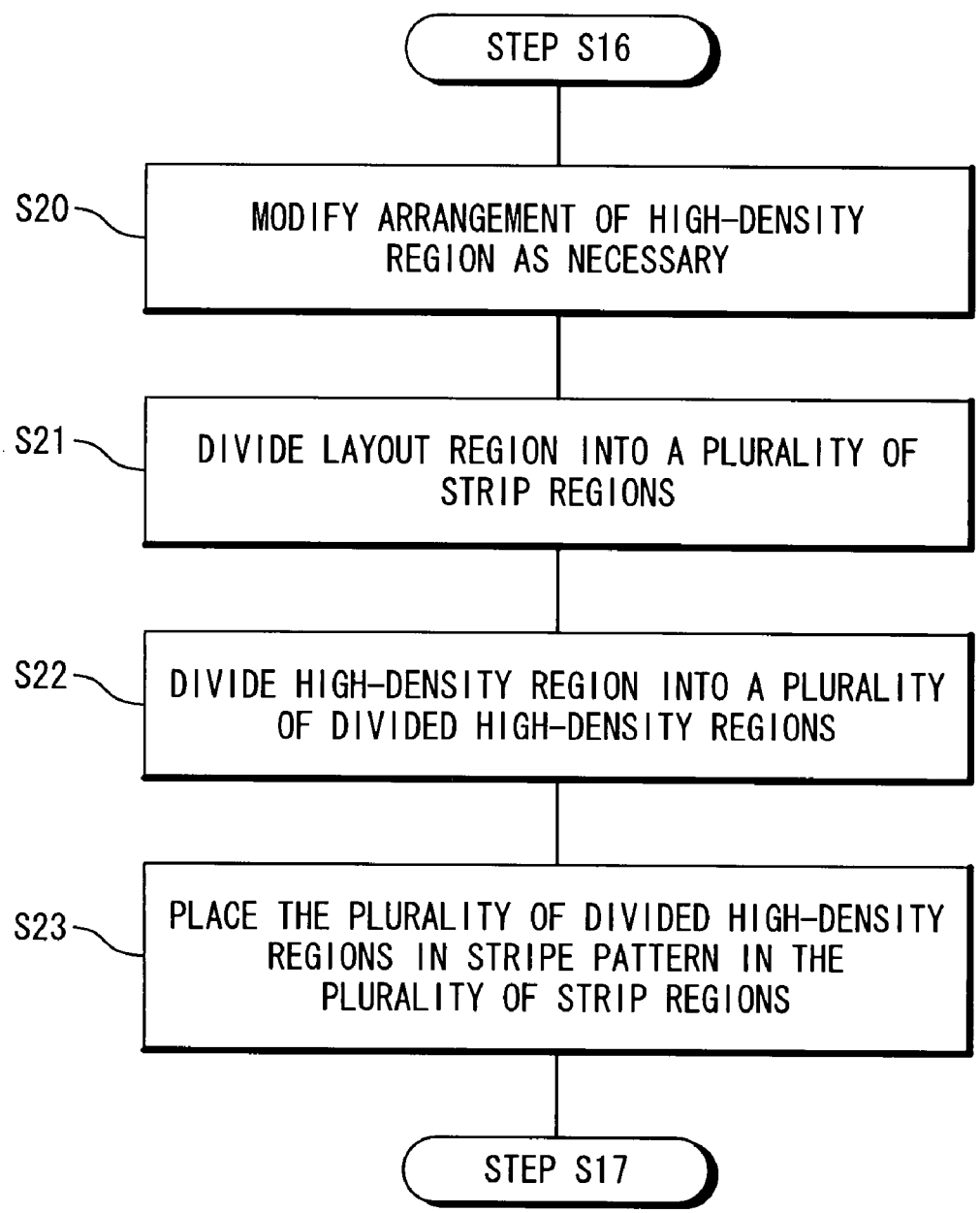
FIG. 11 is a flow chart showing the method of laying out interconnections according to the second embodiment.

FIG. 11 is a flow chart summarizing the method of laying out interconnections according to the present embodiment. According to the present embodiment, the interconnection layout is modified between the Step S16 and the Step S17 shown in FIG. 6.

Step S20:

In a case where the high-density region RH obtained in the Step S16 satisfies the above-mentioned relation (3), the shape of the high-density region RH is not modified. On the other hand, in a case where the high-density region RH obtained in the Step S16 does not satisfy the above-mentioned relation (3), the arrangement and the shape of the high-density region RH can be so modified as to satisfy the relation (3). The reason is that the occupation ratio OCC of the high-density region RH is less than 50% (see FIG. 8).

Step S21:

The layout region LAY is divided into the plurality of strip regions STP (see FIG. 9). For example, the layout region LAY is divided from the left edge towards the X-direction with the same interval. As described above, the width of each strip region STP is preferably equal to the width WS of the scribe line 20.

Step S22:

The high-density region RH is divided into the plurality of divided high-density regions RH' (see FIG. 9). The widths WH of respective divided high-density regions RH' can be equal to or different from each other, as long as they satisfy the above-mentioned relation (4)

Step S23:

The plurality of divided high-density regions RH' are dispersively placed in the corresponding number of the strip regions STP, respectively. More specifically, the plurality of divided high-density regions RH' are placed in at least every other strip region STP. As a result, as shown in FIG. 9, the plurality of divided high-density regions RH' are placed in a stripe pattern. Since the balance of placement of the high-density region RH and the low-density region RL in the semiconductor chip 10 is improved, the dishing of the interlayer insulating film can be further reduced.

3. Semiconductor Device Design System

Figure 12:
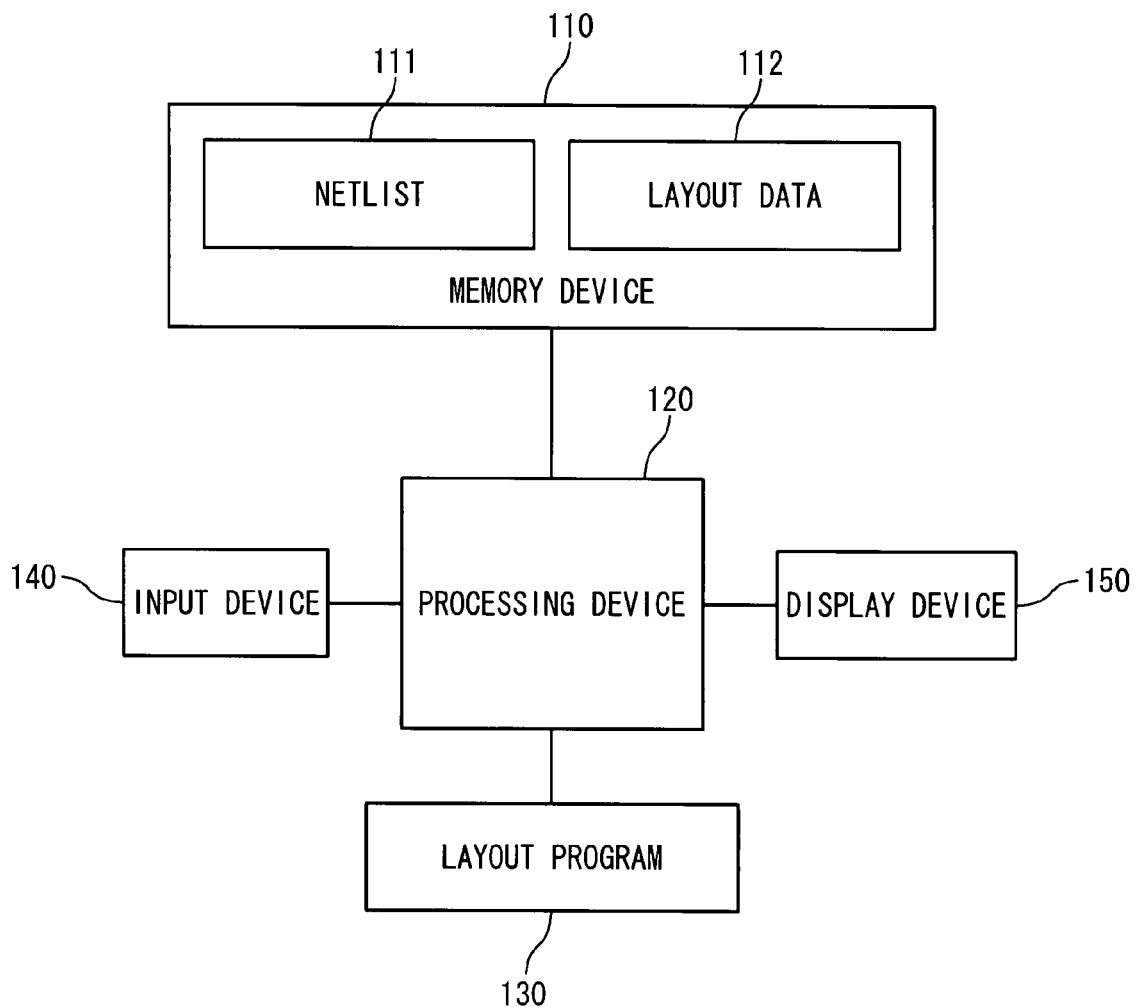
FIG. 12 is a block diagram showing a configuration of a semiconductor device design system according to the embodiments of the present invention.

The method of designing the semiconductor device according to the foregoing embodiments can be achieved by a CAD (Computer Aided Design) system. The CAD system can be constructed appropriately by a person skilled in the art. FIG. 12 is a block diagram showing one example of an LSI design system (CAD system) 100. The LSI design system 100 is provided with a memory device 110, a processing device 120, a layout program 130, an input device 140 and a display device 150.

The memory device 110 is exemplified by a RAM or an HDD. The memory device 110 is configured to store a netlist 111 and a layout data 112. The netlist 111 describes a connection relationship between elements in the design-target circuit. The layout data 112 represents a circuit layout obtained as a result of the layout process.

The layout program 130 is a computer program executed by the processing device 120. Preferably, the layout program 130 is recorded on a computer-readable recording medium.

The input device 140 is exemplified by a key board and a mouse. A designer can input various commands and data by using the input device 140 with reference to information displayed on the display device 150.

The interconnection layout according to the embodiments can be attained by cooperation of the processing device 120 and the layout program 130. In accordance with the layout program 130, the processing device 120 reads out the netlist 111 from the memory device 110 and carries out the method of laying out interconnections based on the netlist 111. As a result, the layout data 112 is produced.

Figure 1A:
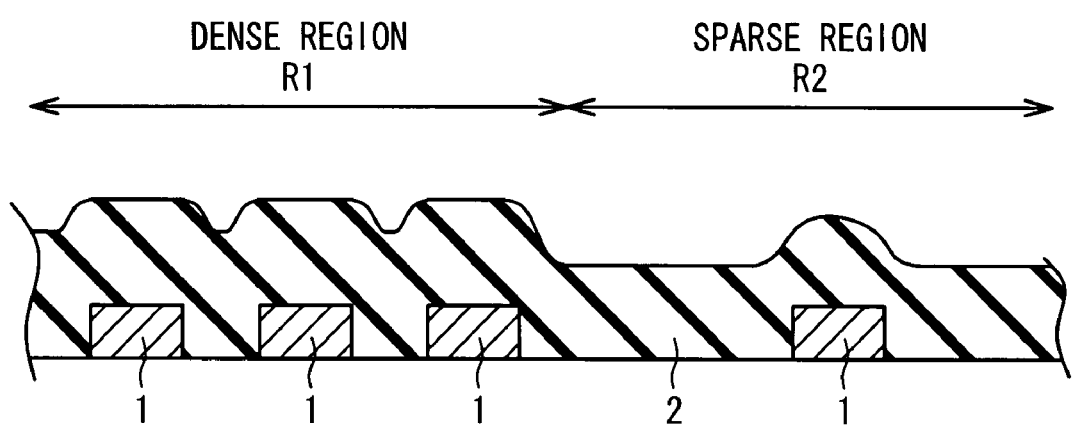
FIG. 1A is a cross-sectional view illustrating a general process of forming an interlayer insulating film.
Figure 1B:
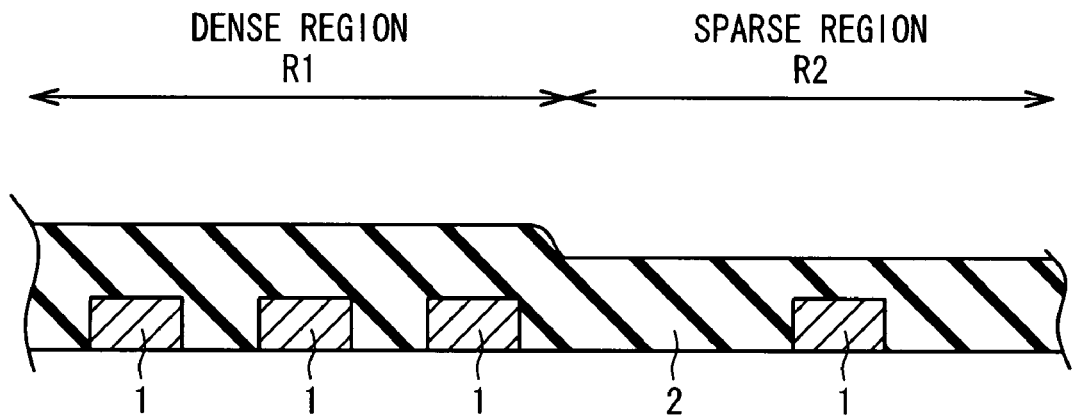
FIG. 1B is a cross-sectional view illustrating a general process of forming an interlayer insulating film.
Figure 2A:
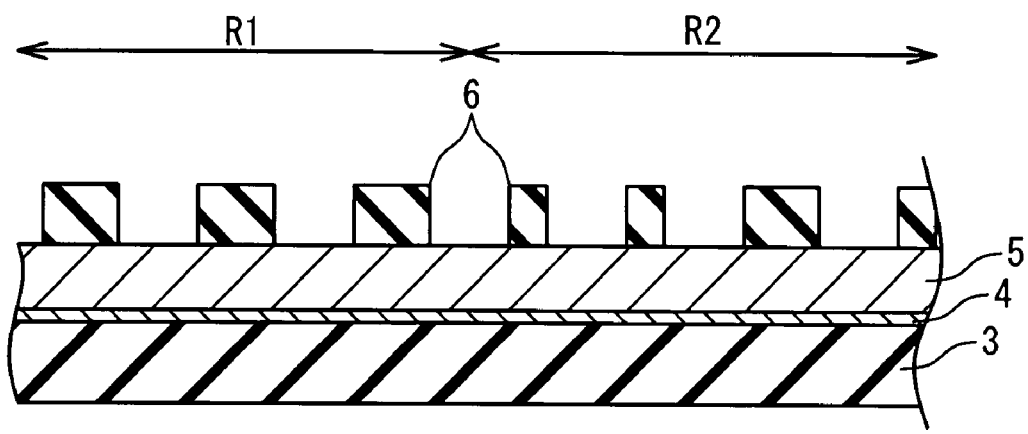
FIG. 2A is a cross-sectional view illustrating a general process of forming interconnections including a dummy interconnection.
Figure 2B:
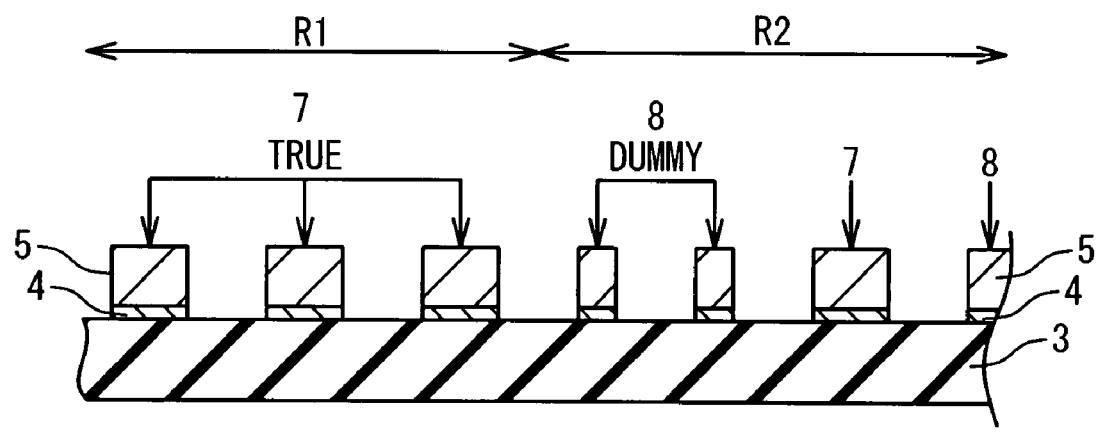
FIG. 2B is a cross-sectional view illustrating a general process of forming interconnections including a dummy interconnection.
Figure 3:
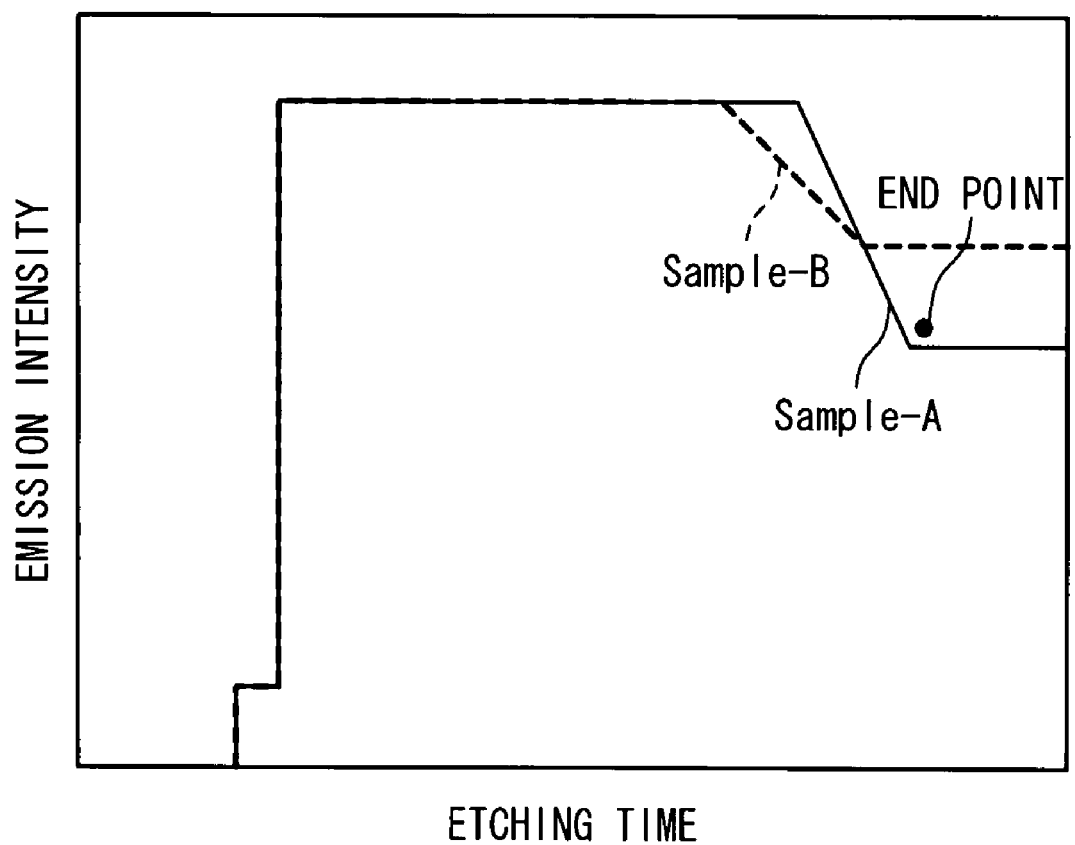
FIG. 3 is a graph showing transition of plasma emission intensity during a dry etching process.

After that, a reticle mask is fabricated based on the layout data 112. Through the photolithography with the use of the reticle mask, the metal interconnections are formed (refer to FIG. 2A and FIG. 2B). According to the embodiments of the present invention, the dummy interconnections are not formed. Therefore, the interconnect capacitance are not increased. Moreover, the end point of the dry etching can be detected with high accuracy, which can prevent the occurrence of over-etching or residue. After that, the interlayer insulating film is formed (refer to FIG. 1A and FIG. 1B). According to the embodiments of the present invention, the dishing of the interlayer insulating film can be suppressed, because the occupation ratio OCC of the high-density region RH is designed to be less than 50% (refer to FIG. 5).

It is apparent that the present invention is not limited to the above embodiments and may be modified and changed without departing from the scope and spirit of the invention.

What is claimed is:

1. A method of designing a semiconductor device using design program recorded on a non-transitory computer-readable medium, comprising:
   (A) dividing a layout region of a semiconductor chip into matrix by a unit region;
   (B) determining an interconnection layout such that an occupation ratio of a high-density region to said layout region is less than 50%, said high-density region being a set of said unit region in which interconnection density is higher than a predetermined reference value; and
   (C) dividing said high-density region into a plurality of divided high-density regions and modifying said interconnection layout by distributing said plurality of divided high-density regions to said layout region.

2. The method according to claim 1, wherein said unit region is a square whose length on a side is smaller than a width of a scribe line.

3. The method according to claim 1, wherein said (B) step includes:
   (b1) determining a provisional interconnection layout;
   (b2) calculating interconnection density of said provisional interconnection layout in said unit region;
   (b3) determining said high-density region by extracting said unit region in which said calculated interconnection density is higher than said predetermined reference value;
   (b4) calculating an occupation ratio of said determined high-density region to said layout region;
   (b5) executing said (b1) to (b4) steps again, if said calculated occupation ratio is equal to or more than 50%; and
   (b6) determining said provisional interconnection layout as said interconnection layout, if said calculated occupation ratio is less than 50%.

4. The method according to claim 1, wherein in said (C) step, said plurality of divided high-density regions are placed in a stripe pattern.

5. The method according to claim 4, wherein an interval between two adjacent divided high-density regions of said plurality of divided high-density regions is larger than a width of a scribe line.

6. The method according to claim 1, wherein said (C) step includes:

(c1) dividing said layout region into a plurality of strip regions, wherein a longitudinal direction of each of said plurality of strip regions is a first direction and said plurality of strip regions align in a second direction orthogonal to said first direction;

(c2) dividing said high-density region into said plurality of divided high-density regions such that a width of each of said plurality of divided high-density regions in said second direction is smaller than a width of said each strip region in said second direction; and (c3) placing said plurality of divided high-density regions in respective strip regions among said plurality of strip regions.

7. The method according to claim 6, wherein in said (c3) step, said plurality of divided high-density regions are placed in at least every other strip region with respect to said plurality of strip regions.

8. The method according to claim 6, wherein in said (c1) step, said layout region is divided by lines equally spaced from an edge towards said second direction.

9. The method according to claim 8, wherein said width of said each strip region in said second direction is equal to a width of a scribe line.

10. A design program recorded on a non-transitory computer-readable medium that, when executed, causes a computer to perform a process comprising:

(A) dividing a layout region of a semiconductor chip into matrix by a unit region;

(B) determining an interconnection layout such that an occupation ratio of a high-density region to said layout region is less than 50%, said high-density region being a set of said unit region in which interconnection density is higher than a predetermined reference value; and (C) dividing said high-density region into a plurality of divided high-density regions and modifying said interconnection layout by distributing said plurality of divided high-density regions to said layout region.

11. The design program according to claim 10, wherein said (B) step includes:

(b1) determining a provisional interconnection layout;

(b2) calculating interconnection density of said provisional interconnection layout in said unit region;

(b3) determining said high-density region by extracting said unit region in which said calculated interconnection density is higher than said predetermined reference value;

(b4) calculating an occupation ratio of said determined high-density region to said layout region;

(b5) executing said (b1) to (b4) steps again, if said calculated occupation ratio is equal to or more than 50%; and (b6) determining said provisional interconnection layout as said interconnection layout, if said calculated occupation ratio is less than 50%.

12. The design program according to claim 10, wherein said (C) step includes:

(c1) dividing said layout region into a plurality of strip regions, wherein a longitudinal direction of each of said plurality of strip regions is a first direction and said plurality of strip regions align in a second direction orthogonal to said first direction;

(c2) dividing said high-density region into said plurality of divided high-density regions such that a width of each of said plurality of divided high-density regions in said second direction is smaller than a width of said each strip region in said second direction; and (c3) placing said plurality of divided high-density regions in respective strip regions among said plurality of strip regions.

\* \* \* \* \*